United States Patent [19]
Mittel

[11] Patent Number: 5,986,598
[45] Date of Patent: Nov. 16, 1999

[54] SIGMA DELTA DATA CONVERTER WITH FEED-FORWARD PATH TO STABILIZE INTEGRATOR SIGNAL SWING

[75] Inventor: James G. Mittel, Lake Worth, Fla.

[73] Assignee: Motorola, Inc., Schaumburg, Ill.

[21] Appl. No.: 08/994,524

[22] Filed: Dec. 19, 1997

[51] Int. Cl.[6] .............................. H03M 3/00; H03M 1/12
[52] U.S. Cl. .......................................... 341/143; 341/155
[58] Field of Search .................................... 341/143, 144, 341/155, 110, 166, 165

[56] References Cited

U.S. PATENT DOCUMENTS

| 4,857,928 | 8/1989 | Gailus et al. | 341/143 |
|---|---|---|---|
| 5,191,332 | 3/1993 | Shieu | 341/143 |
| 5,557,642 | 9/1996 | Williams | 375/316 |
| 5,777,512 | 7/1998 | Tripathi et al. | 330/207 |

Primary Examiner—Brian Young
Assistant Examiner—Peguy JeanPierre
Attorney, Agent, or Firm—James A. Lamb

[57] ABSTRACT

A sigma delta analog-to-digital converter (100) comprising a second or third order integrator block (105) featuring a feed-forward connection path between the input of the integrator block and an input of at least one of the plurality of integrators (130 or 150). A comparator (180) coupled to the output of the integrator block (105) generates as output a digital value representing a difference between the integrator output signal with respect to a threshold, or in a differential mode implementation, between component signals of a differential signal output by the integrator block (105). A digital sampling element (190) coupled to the output of the comparator (180) samples the output of the comparator (180) in response to a sampling clock signal at a predetermined sampling frequency to generate as output digital signal comprising samples of the digital values output by the comparator (180).

24 Claims, 8 Drawing Sheets

LEVEL OF ANALOG INPUT SIGNAL

LEVEL OF ANALOG INPUT SIGNAL

SIGMA DELTA DATA CONVERTER WITH FEED-FORWARD PATH TO STABILIZE INTEGRATOR SIGNAL SWING

FIELD OF THE INVENTION

The present invention is directed to a data converter, and more particularly to a sigma delta analog-to-digital converter with a stabilized integrator signal swing so as to be substantially independent of the input signal level.

BACKGROUND OF THE INVENTION

In the field of wireless communication devices, significant efforts are being made to use digital signal processing techniques to perform many of the signal processing tasks more commonly performed with analog circuitry. For example, it is desirable to convert an analog signal derived from a received radio frequency (RF) signal to a digital signal so that subsequent filtering and demodulating tasks can be performed digitally.

A data converter device called a "sigma delta" data converter is useful in converting an analog signal to a digital signal, and vice versa. The sigma delta data converter consists of one or more integrators. Prior art continuous time sigma delta data converters have integrator signal swings that are a direct function of the input signal level. This can cause problems particularly when the sigma delta data converter is implemented with a basic complementary metal-oxide semiconductor (CMOS) process, often a preferred implementation to meet integration requirements. Simple CMOS processes do not typically provide capacitors that remain linear over the integrator signal swing variations imposed on the data converter. Double poly capacitors can be used in their place, but this increases the costs and inhibits comprehensive integration.

A data converter is needed which can be implemented in such a manner to allow for complete integration with other circuit functionalities using conventional semiconductor processes without degrading the performance characteristics causes by anticipated integrator signal swing.

DESCRIPTION OF A PREFERRED EMBODIMENT

Figure 1:
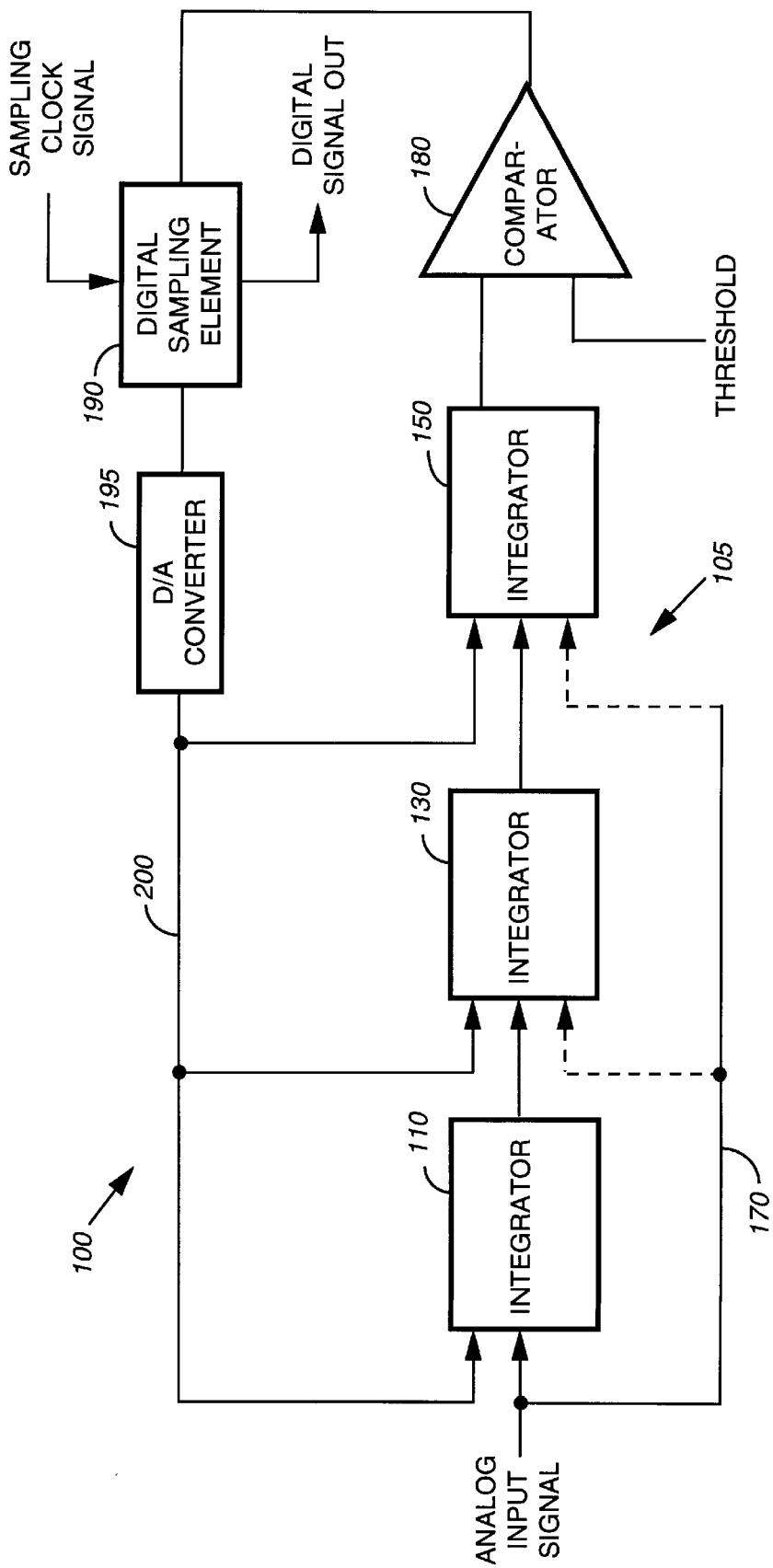
FIG. 1 is a block diagram of a sigma delta data converter according to the present invention.

Referring first to FIG. 1, the sigma delta data converter according to the present invention is generally shown at 100. The sigma delta data converter 100 receives an analog input signal and generates as output a digital signal representative of the analog input signal. FIG. 1 is a general diagram insofar as it shows the sigma delta data converter in a non-differential mode implementation.

The sigma delta data converter 100 comprises an integrator block 105 comprising at least two integrators, but preferably, three integrators, shown at 110, 130 and 150. The integrators 110, 130 and 150 are connected in a cascade configuration. The first integrator 110 comprises an input and an output The input of the integrator block 105, which corresponds to the input of the first integrator 110, is coupled to receive an analog input signal and the first integrator 110 integrates the analog input signal to generate as output a first integrated signal. The second integrator 110 comprises an input and an output, the input being coupled to the output of the first integrator 110 to receive the first integrated signal. The second integrator 130 integrates the first integrated signal and generates as output a second integrated signal.

The integrator block 105 is preferably either a second order integrator or a third order integrator. When it is a third order integrator, the third integrator 150 is provided comprising an input and an output, the input being coupled to the output of the second integrator 130. The third integrator 150 integrates the second integrated signal and generates as output a third integrated signal.

The integrator block 105 generates as output an integrator output signal. The integrator output signal corresponds to either the second integrated signal when the integrator block 105 is a second order integrator, or the third integrated signal when the integrator block 105 is a third order integrator.

A feed-forward connection path 170 is provided between the input of the first integrator 110 and the input of the second integrator 130, if only two integrators are used. When three integrators are used, the feed-forward connection path 170 connects the input of the first integrator 110 with the inputs of both the second integrator 130 and the third integrator 150. The purpose of the feed-forward connection path 170 is to add the analog input signal to the first integrated signal and an analog feedback signal to generate a signal which is integrated by the second integrator 130, and in the case of a third order integrator block, to add the analog input signal to the second integrated signal and the analog feedback signal to generate a signal which is integrated by the third integrator 150.

A comparator 180 is coupled to the output of either the second integrator 130 or if two integrators are used, or of the third integrator if three integrators are used. The comparator 180 compares the second integrated signal (or third integrated signal as the case may be) with a threshold to generate as output on a continuous basis a digital value that represents a difference between the second integrated signal and the threshold.

A digital sampling element 190 is coupled to the output of the comparator 180 and samples the digital values output by the comparator 180 at a predetermined frequency corresponding to a sampling clock frequency of a sampling clock signal. The output of the sigma delta data converter 100 is a stream of digital values representing samples of the digital signal output by the comparator.

A digital-to-analog converter 195 converts each sample of the digital signal to generate the analog feedback signal which is coupled in the integrator feedback path 200 to the integrators. An integrator feedback path 200 couples the analog feedback signal to the integrators.

The feed-forward path 170 stabilizes the integrator swings without comprising other performance parameters. Consequently, the signal swing of the integrators is substantially independent of the level of the analog input signal. The feed-forward connection path 170 affords significant performance improvement over prior art sigma delta data converters.

Figure 2:
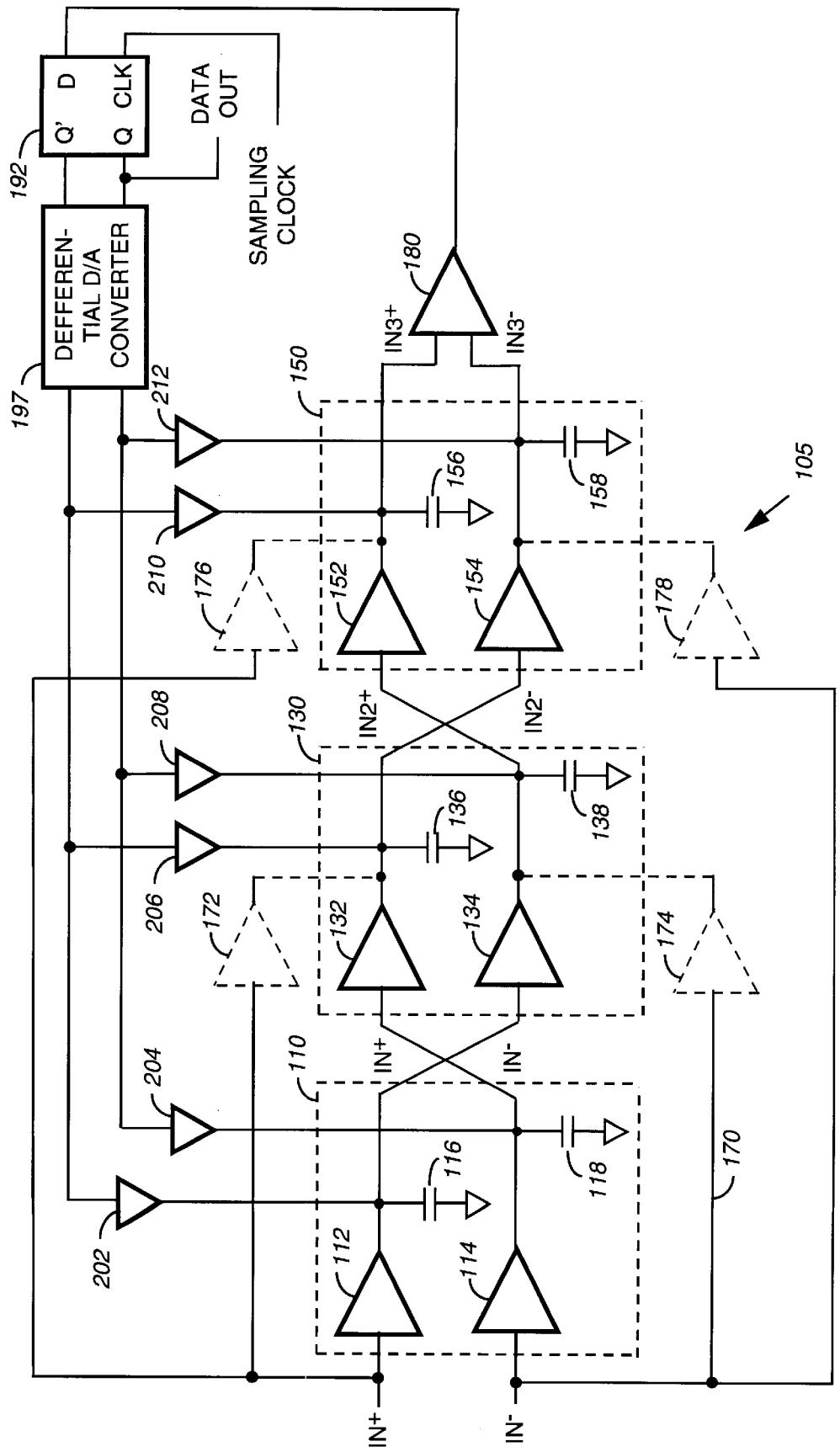
FIG. 2 is a schematic diagram of a sigma delta data converter in differential mode implementation.

Turning to FIG. 2, the sigma delta data converter 100 is shown in a one-bit differential mode analog-to-digital converter implementation. The first integrator 110, second integrator 130 and third integrator 150 are differential integrators each comprising differential inputs and differential outputs. The first differential integrator 110 comprises first and second transconductance amplifiers 112 and 114, and first and second capacitors 116 and 118. The differential inputs of the first differential integrator 110 receive as input a differential analog input signal comprising component signals IN$^+$ and IN$^-$. The first differential integrator generates as output a first integrated differential signal comprising component signals IN1$^+$, INS1$^-$.

The second differential integrator 130 comprises first and second transconductance amplifiers 132 and 134 and first and second capacitors 136 and 138 and integrates a differential signal derived from the first differential integrated signal to generate as output a second integrated differential signal comprising component signals IN2$^+$ and IN2$^-$. If only two integrators are used, then the second differential integrated signal is coupled to first and second inputs, respectively, of comparator 180. Otherwise, it is connected as input to the third differential integrator 150.

The third differential integrator 150 comprises first and second transconductance amplifiers 152 and 154, and first and second capacitors 156 and 158. The third differential integrator 150 integrates the a differential signal derived from the second integrated differential signal and generates as output a third integrated differential signal comprising component signals IN3$^+$ and IN3$^-$. The third integrated differential signal is coupled to the first and second inputs of the comparator 180.

The feed-forward connection path 170 consists of connections between the differential inputs of the first differential integrator 110 and corresponding points of the second differential integrator 130, and of the third differential integrator 150 when three integrators are used. If only two integrators are used, then a first transconductance amplifier 172 couples the analog input component signal IN$^+$ to the output of the first transconductance amplifier 132 and the second transconductance amplifier 174 couples the input analog component signal IN$^-$ to the output of the second transconductance amplifier 134. As a result, the second differential integrator 130 integrates a differential signal which is the sum of the first integrated differential signal, a differential feedback signal and the differential analog input signal. That is, the current signal generated by the transconductance amplifier 172 is added to the current signal output by the transconductance amplifier 132. Likewise, the current signal generated by the transconductance amplifier 174 is added to the current signal output by the transconductance amplifier 134.

Similarly, if three integrators are used, then in addition to the connections described above to the second differential integrator 130, the transconductance amplifier 176 couples the differential analog input component signal IN$^+$ to the output of the first transconductance amplifier 152 and the transconductance amplifier 178 couples the differential analog input component signal IN$^-$ to the output of the second transconductance amplifier 154. Consequently, the third differential integrator 150 integrates a differential signal which is a sum of the second differential signal, the differential feedback signal and the differential analog input signal.

The feed-forward connection path serves to stabilize the signal swings of all of the integrators, and the signal swing generated is substantially independent of the analog input signal.

The comparator 180 compares the level of the second integrated differential component signals IN2$^+$ and IN3$^-$ or the third integrated differential component signals IN3$^+$ and IN3$^-$, and continuously generates a digital value which represents the difference between the component signals. Specifically, in a one-bit analog-to-digital implementation with a third order integrator block, the comparator 180 compares the level of component signal IN3$^+$ with the level of the component signal IN3$^-$ and generates a logic "1" if component signal IN3$^+$ is greater than component signal IN3$^-$, and otherwise generates a logic "0". Thus, the output of the comparator is one bit, either "1" or "0".

The output of the comparator 180 is connected to a one-bit digital sampling element, such as a D-type flip-flop 192. Specifically, the output of the comparator 180 is connected to the D input of the flip-flop 192 to supply a logic "1" or logic "0" thereto. The flip-flop 192 is clocked by a sampling clock signal whose frequency s corresponds to a desired sampling frequency of the analog input signal. The Q output of the flip-flop 192 corresponds to the digital signal representation of the analog input signal. The digital signal comprises a one-bit value of "1" or "0" at the sampling clock frequency depending on the relationship of the signals applied to the comparator 180.

The function of the flip-flop 192 may be achieved by other forms of sample-and-hold elements, such as other flip-flop types, half latches and other similar devices that sample and hold the history of the output of the comparator. Alternately, the comparator 180 includes a latch to sample and hold its output.

The integrator feedback path 200 to the integrators includes a differential digital-to-analog (D/A) converter 197 which converts the signals at Q and Q' of the flip-flop 192 to complementary analog feedback signals, defining a differential analog feedback signal. These analog feedback signals are coupled to the first integrator 110 via transconductance amplifiers 202 and 204, to the second integrator 130 via transconductance amplifiers 206 and 208 and to the third integrator 150 via transconductance amplifiers 210 and 212.

Figure 3:
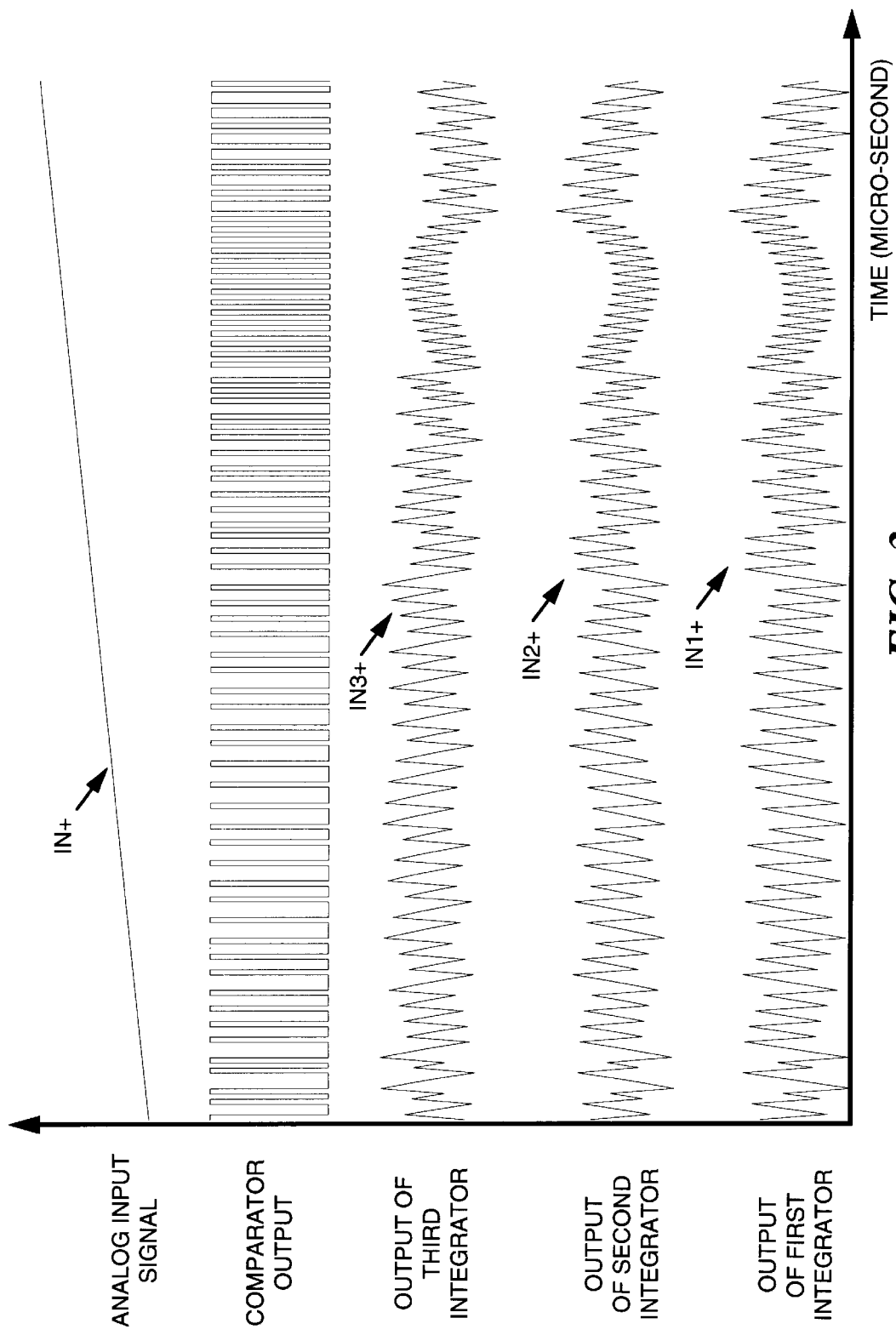
FIG. 3 is a graphical diagram showing how the sigma delta data converter operates on an analog input signal.

With reference to FIGS. 2 and 3, the operation of the sigma delta data converter 100 is described. The differential analog input signal (IN$^+$, IN$^-$) is coupled to the differential inputs of the first differential integrator 110. This signal is integrated two or three times, and the integrator output signal (either the second integrated differential signal or the third integrated differential signal) is coupled to the first and second inputs of the comparator 180. The comparator 180 outputs a digital signal comprising either a logic "1" or a logic "0" depending on the relationship of the signals at its inputs.

FIG. 3 shows one component signal of a differential analog input signal, such as IN$^+$. The time scale for the signals shown in FIG. 3 is in microseconds, so a sinusoidal analog input signal appears like a straight line. The output of the first integrator, IN1$^+$ is shown at the bottom of FIG. 3, and the outputs of the second and third integrators, IN2$^+$ and IN3$^+$, respectively, are shown above it. The output of the comparator 180 is shown with respect to the differential component input signal IN$^+$. When the sampling clock frequency is very fast, such as 8 MHz, the "1's" and "0's" of the digital signal represent the analog input signal very closely.

Figure 4:
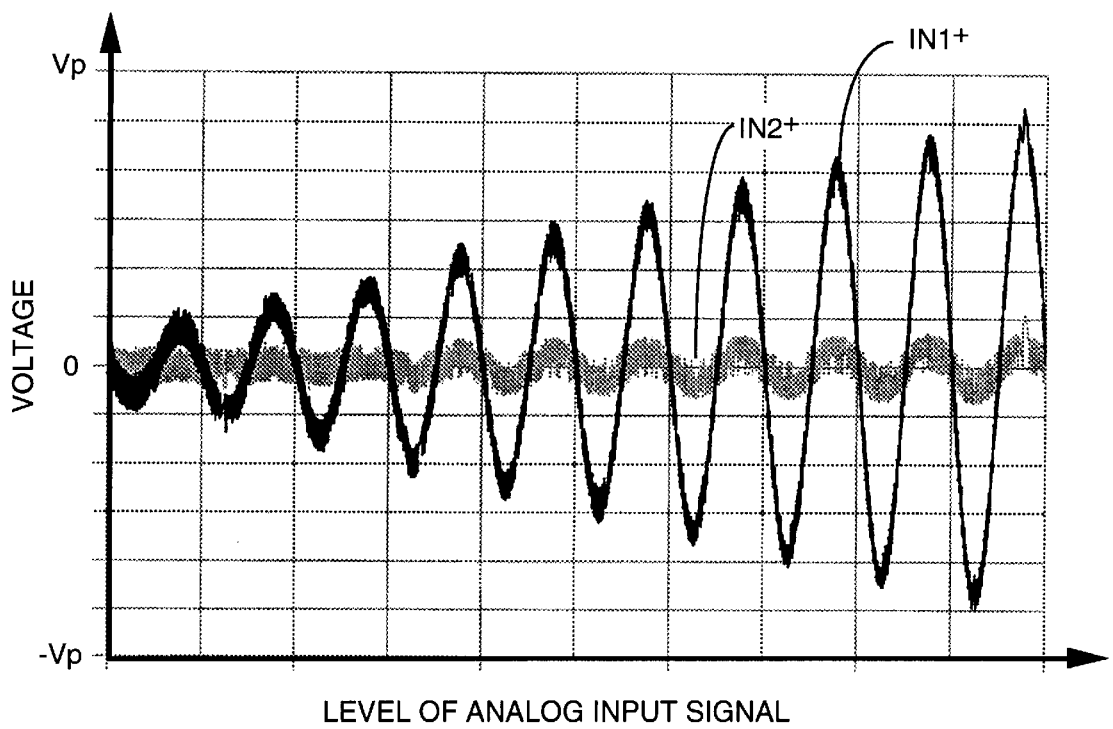
FIG. 4 is a graphical diagram showing the integrator signal swing of a sigma delta data converter according to the prior art.
Figure 5:
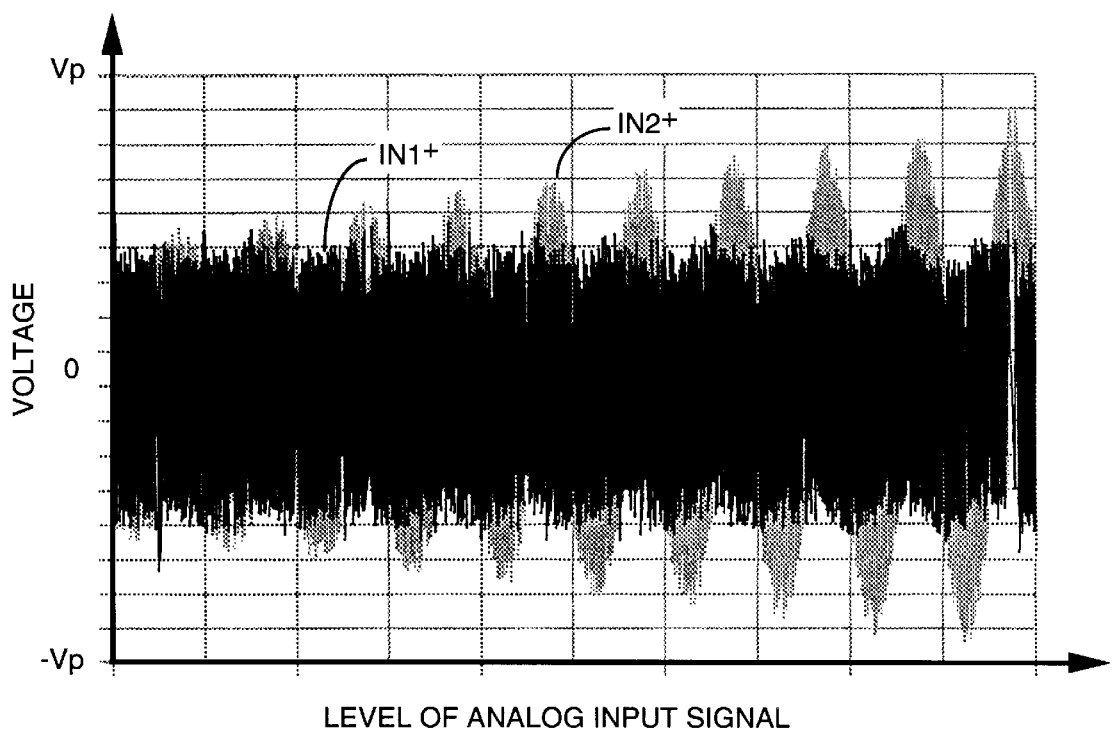
FIG. 5 is a graphical diagram showing the stabilized integrator signal swing of the sigma delta data converter according to the present invention.

Referring now to FIGS. 4 and 5, the operation of the sigma delta data converter 100 is compared with that of the prior art. FIG. 4 shows a plot of the signals IN1$^+$ and IN2$^+$ as the level of the analog input signal is varied from zero to a maximum value for a second order implementation of the sigma delta data converter without the feed-forward connection path. It is evident from FIG. 4 that as the level of the analog input signal increases, the level of the signal at the output of the first integrator changes excessively, and the signal IN2$^+$ does not follow the signal IN1$^+$. This limits the performance of the operation of the sigma delta data converter.

FIG. 5 shows a plot for the same signals from the sigma delta data converter 100, having the feed-forward path connection path between the input of the first integrator and the second integrator. The feed-forward connection path significantly reduces the swing of integrator signal IN1$^+$ and integrator signal IN2$^+$ much more closely follows integrator signal IN1$^+$ even as the level of the analog input signal varies. The integrator signal swings are stabilized without compromising other performance parameters.

The feed-forward connection path in the sigma delta data converter achieves desired performance characteristics using simple CMOS processed even with capacitors that are non-linear over anticipated integrator signal swings. Therefore, the sigma delta. data converter can be implemented in a less expensive semiconductor process, but still perform to desired standards and specifications.

Figure 6:
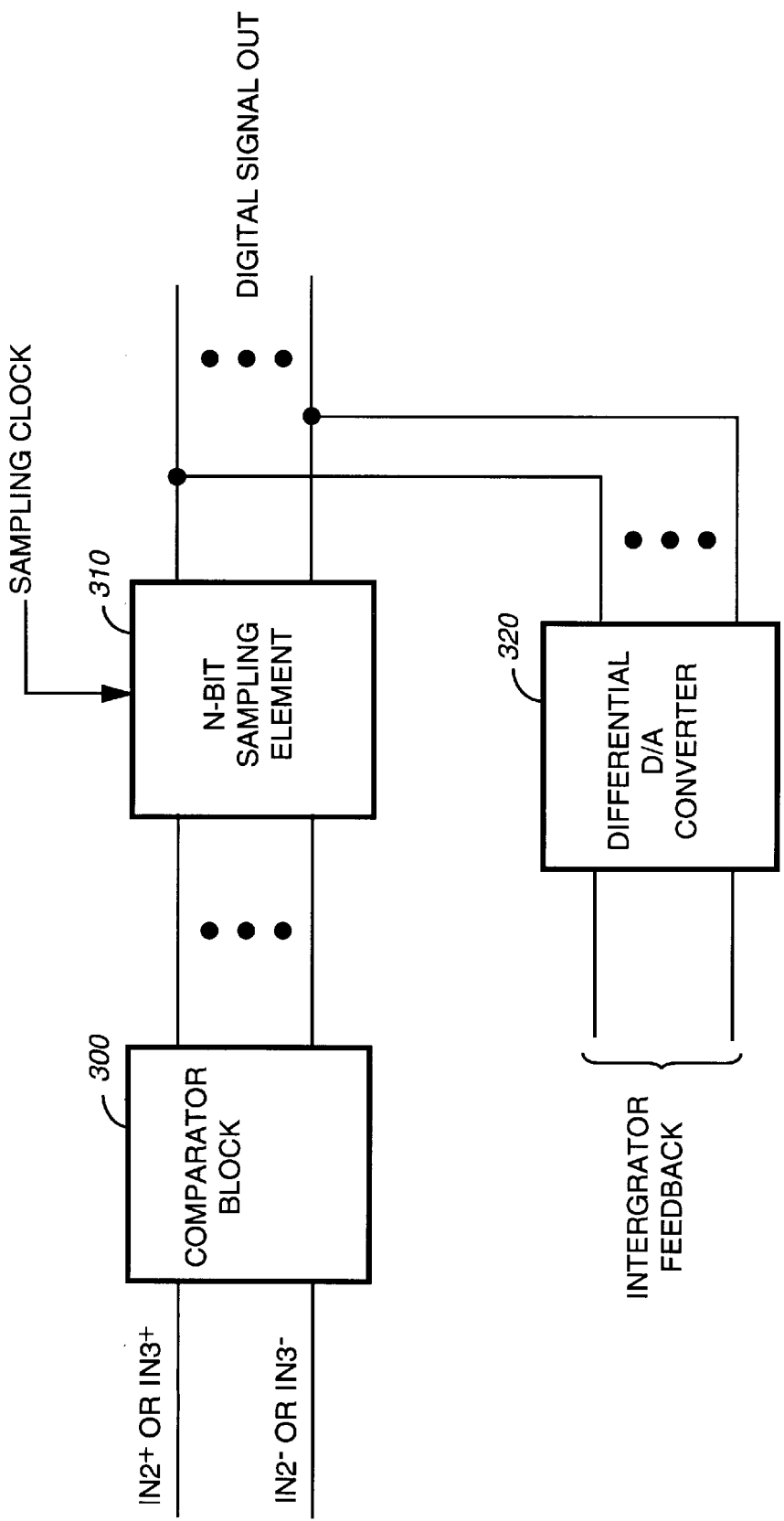
FIG. 6 is a block diagram of a portion of a sigma delta data converter according to an alternative embodiment of the present invention.

FIG. 6 illustrates a portion of the sigma delta data converter according to an alternative embodiment of the present invention. The output of either the second or third differential integrator is connected to the input of a comparator block 300 which compares the integrator output signal with several thresholds to continuously generate a multi-bit digital value. For example, in the differential mode implementation, the comparator block 300 compares the difference between component signals IN2$^+$ and IN2$^-$, or between component signals IN3$^+$ and IN3$^-$, with several threshold levels to generate an N-bits representing the difference between the respective integrator differential signals. This provides greater resolution in the digital signal representation of the analog input signal.

The N-bit digital signal is sampled and stored in an N-bit sampling element 310, such as an N-bit register. The N-bit sampling element 310 is also coupled to a differential D/A converter 320 to generate the differential integrator feedback signals.

The number of bits per sample depends on the resolution of the comparisons made by the comparator block 300. With greater resolution, the sampling clock frequency can be reduced, for certain applications. For example, the comparator block 300 comprises a plurality of comparators to compare the difference between the differential integrator signals with three thresholds, so as to generate a 2 bit digital signal depending on where the difference falls with respect to three thresholds. That is, "00" is assigned to the condition where the difference is below all thresholds, "01" is assigned to the condition where the difference is greater than a first threshold, but less than the second threshold, "10" is assigned to the condition where the difference is greater than the second threshold but less than the third threshold, and "11" is assigned to the case where the difference is greater than all of the thresholds. There are many ways to configure the comparators to perform this comparison process, as is well known in the art. Moreover, the N-bit sampling element 310 may take the form of other types of sample-and-hold elements, similar to that described above in conjunction with FIG. 2.

Figure 7:
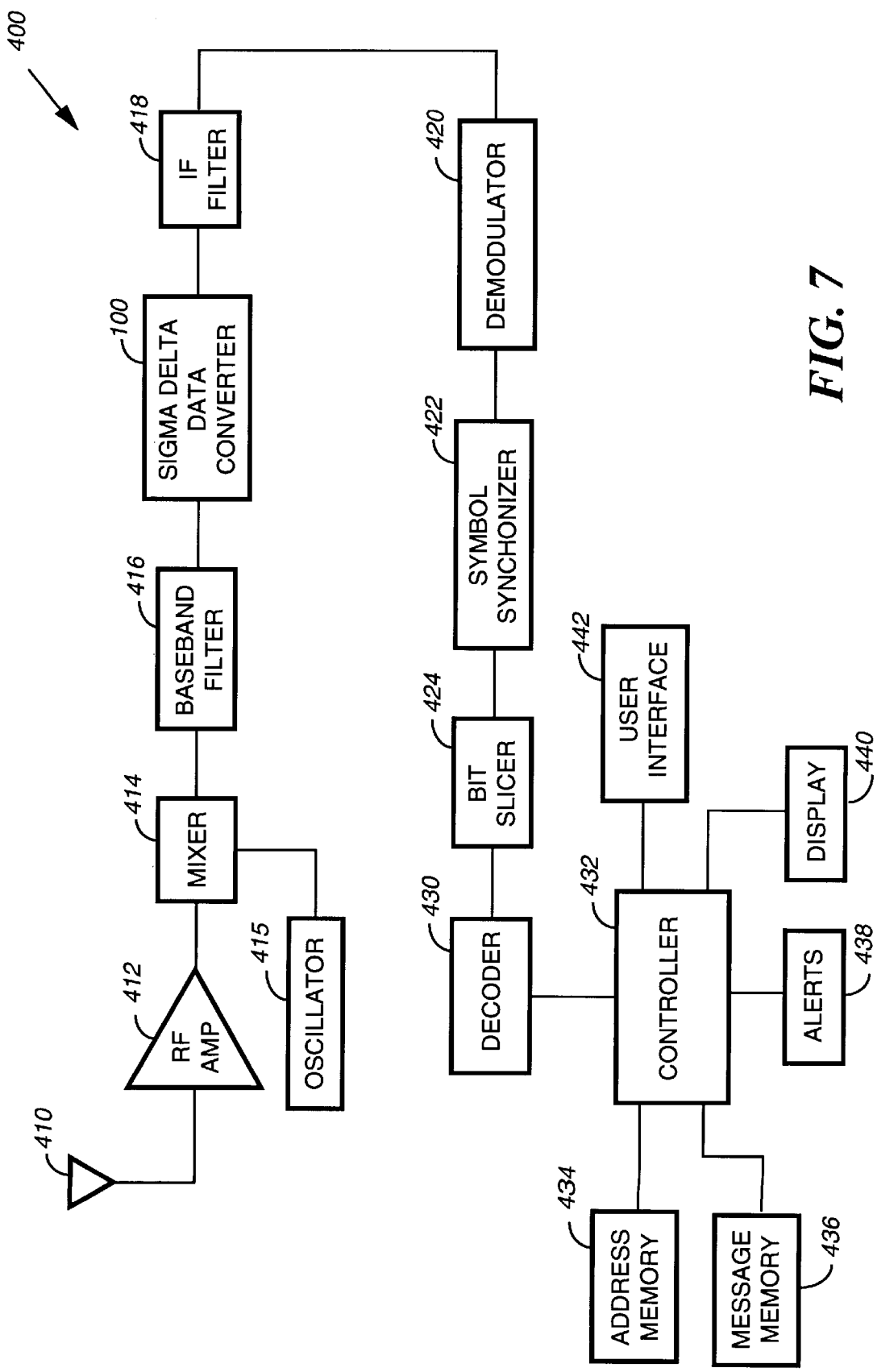
FIG. 7 is a block diagram of a communication device using the sigma delta data converter according to the present invention.

Turning to FIG. 7, a communication device using the sigma delta data converter 100 is shown generally at 400. As an example, the communication device is a selective call communication device (receiver or transceiver). The communication device 400 comprises an antenna for detecting radio frequency (RF) signal. An RF amplifier 412 is connected to the antenna 410 to amplify the detected RF signals and generate an amplified signal. A mixer 414 is connected to the RF amplifier and mixes the amplified signal with an oscillator signal generated by an oscillator 415 to generate a mixed-down signal. In a zero intermediate frequency (IF) receiver architecture, the mixer 414 is coupled to a baseband filter 416. The baseband filter 416 is, for example, an anti-aliasing filter. In a non-zero intermediate frequency architecture, there are additional mixer stages before baseband filtering is performed.

In either case, the sigma delta data converter 100 is used as an A/D converter to convert a baseband signal output by the baseband filter 416 to a digital signal for further processing. The output of the sigma delta data converter 100 is a digital signal comprising a stream of one bit or N-bit samples of the analog signal, and is coupled to an IF filter 418, which is a digital filter circuit. The IF filter 418 outputs a filtered (or decimated) digital signal at an even lower frequency that is coupled to a demodulator 420.

The demodulator 420, also a digital circuit, demodulates the filtered digital signal to generated a digital demodulated signal representing the baseband modulation of the RF signal. The symbol synchronizer 422 determines the center of symbols (modulation levels) of the digital demodulated signal and controls a bit slicer 424 to sample the digital demodulated signal at the symbol centers. The bit slicer 424 compares the values of the digital demodulated signal at the symbol centers to output a digital data representing the modulation level of the digital demodulated signal. For example, if the digital demodulated signal is interpreted as representing two level frequency modulated (FM) information, the bit slicer 424 outputs "0" or "1", and if the digital demodulated signal is interpreted as representing four level FM information, the bit slicer outputs "00", "10", "11" or "01".

A decoder 430 is connected to the output of the bit slicer 424. The decoder is device specifically designed to decode a signal formatted in accordance with a known protocol, such as the Motorola FLEX™ paging protocol technology. The decoder 430 extracts address, message and other control information from the digital data output by the bit slicer 424. A controller 432, embodied by a microprocessor, is connected to the decoder 430 and is responsive to the information output by the decoder 430 to control the operation of the communication device. The controller 432 compares received address information with one or more stored addresses in the address memory 434 to determine when a message addressed to the communication device is received. The controller 432 stores messages address to the communication device in a message memory 436. It also generates audible or visual alerts on the alerts device 438. The received messages are displayed on a display. User control of the communication device is provided by way of a user interface 442, which may consist of buttons, touch screen, etc., as is well known in the art.

Figure 8:
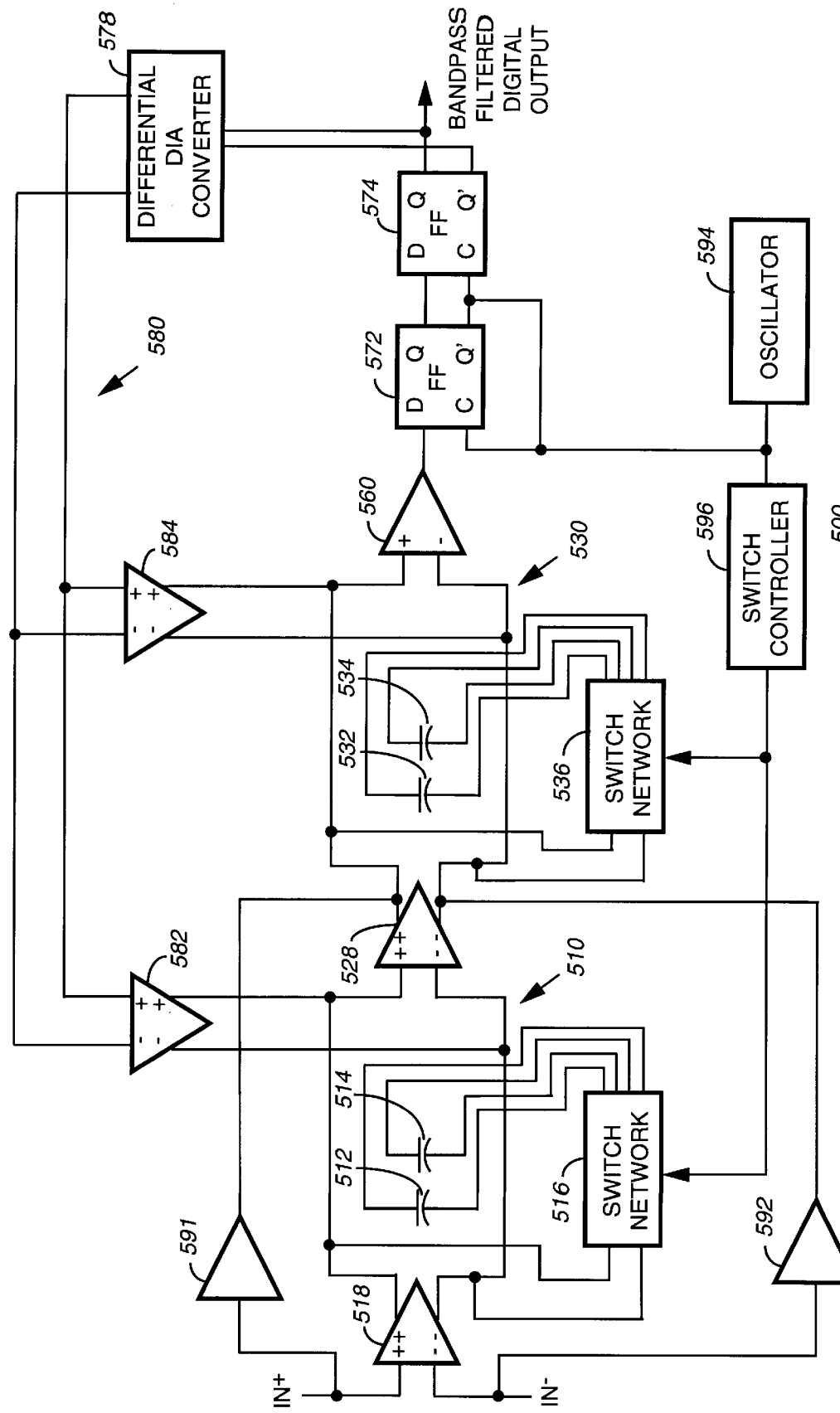
FIG. 8 is a block diagram of a bandpass sigma delta data converter according to the present invention.
Figure 9:
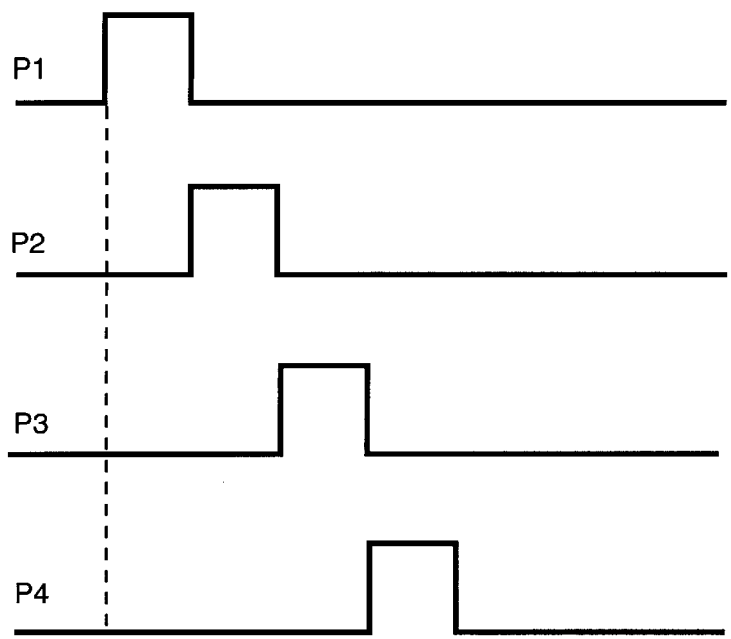
FIG. 9 is a timing diagram of a set of switch control signals in the bandpass sigma delta analog-digital-converter of FIG. 8.

The sigma delta data converter described in the foregoing is a low pass device insofar as the integration performed by the integrator block 105 is a low pass operation, i.e., it has a pole at zero. That is, each of the integrators in the integrator block 105 is a low pass integrator (differential or non-differential). FIG. 8 illustrates a bandpass sigma delta data converter 500 in which the integration is in a bandpass configuration, that is, having a non-zero pole. The bandpass sigma delta data converter 500 comprises a bandpass integrator block comprising at least two bandpass integrators 510 and 530 connected in a cascade configuration. A second order implementation of the integrator block is shown in FIG. 8, though it should be understood that a third order implementation is also envisioned, with three bandpass integrators. Each bandpass integrator 510 and 530 comprises a plurality of capacitors and a switch network to control how the capacitors are connected with a differential signal, in either a normal or positive configuration, a negative or inverted configuration or a floating configuration. Specifically, the bandpass integrator 510 comprises a first capacitor 512 and a second capacitor 514. A switch network 516 controls how the capacitors 512 and 514 are connected to the output of the differential transconductance amplifier 518. The bandpass integrator 530 is identical to the bandpass integrator 510. It comprises a first capacitor 532 and a second capacitor 534. A switch network 536 controls how the capacitors 532 and 534 are connected to the output of the differential transconductance amplifier 528.

The differential output of the first bandpass integrator 510 is coupled to the differential input of the differential transconductance amplifier 528. The differential output of the second bandpass integrator 530 is connected to first and second inputs of a comparator 560. The comparator 560 operates in the same manner as comparator 180 of FIG. 2. In the case of the bandpass sigma delta data converter 500, the digital sampling element 570 consists of a first D-type flip-flop 572 and a second D-type flip-flop 574. Two flip-flops are used in order to generate the proper further delay of the output of the comparator 560. A differential feedback signal is generating by a differential D/A converter 578 and is connected by the feedback path 580 to the integrator block 505. The differential feedback signal is converted to a differential current signal by either the differential transconductance amplifier 582, which couples the differential current signal to the first bandpass integrator 510, or by the differential transconductance amplifier 584, which couples the differential current signal to the second bandpass integrator 530.

A feed-forward connection path connects the differential analog input signal to the second bandpass integrator 530. In particular, a transconductance amplifier 591 generates a current signal from the positive component, $IN^+$, of the differential analog input signal, which is added to the positive output of the differential transconductance amplifier 528. Similarly, a transconductance amplifier 592 generates a current signal from the negative component, $IN^-$, of the differential analog input which is added to the negative output of the differential transconductance amplifier 528.

A sampling clock signal is generated by an oscillator 594 to control the flip-flops 572 and 574. In addition, a switch controller 596 generates switch control signals based on the sampling clock signal to control the switch networks 516 and 536. For example, the switch controller 596 generates switch control signals to control how the capacitors of the corresponding bandpass integrator are connected.

The number of capacitors in each bandpass integrator may vary, and the manner in which they are connected depends on the number of capacitors. For example, with two capacitors, there are 4 phases of operation; for 3 capacitors there are 6 phases of operation, and for 4 capacitors there are 8 phases of operation. The number of capacitors determines the fraction of the sampling clock frequency at which each bandpass integrator has passbands. That is, for 2 capacitors, the bandpass integrators have passbands at multiplies of ¼ of the sampling clock frequency. In general, for N capacitors in each integrator, there 2 * N phases of operation, yielding passbands at 1/(2*N) of the sampling clock frequency.

Figure 10:
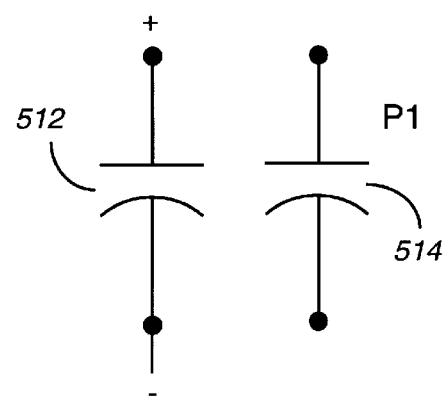
FIGS. 10–13 are schematic diagrams illustrating a connection configuration of capacitors in each of the bandpass integrators of the bandpass sigma delta data converter of FIG. 8.
Figure 11:
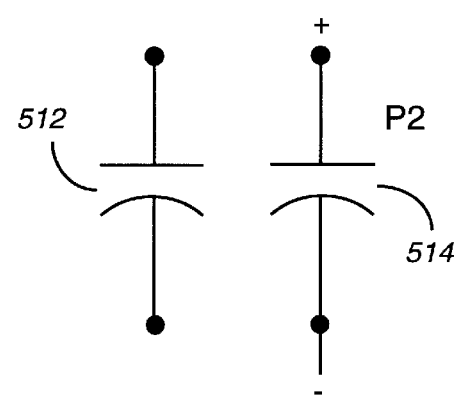
Figure 12:
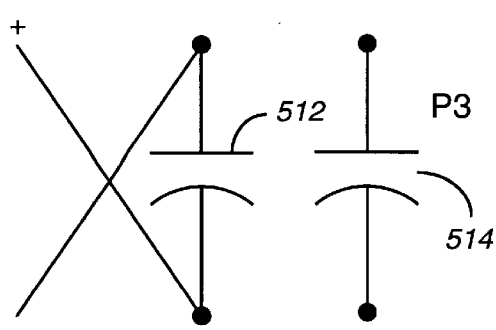
Figure 13:
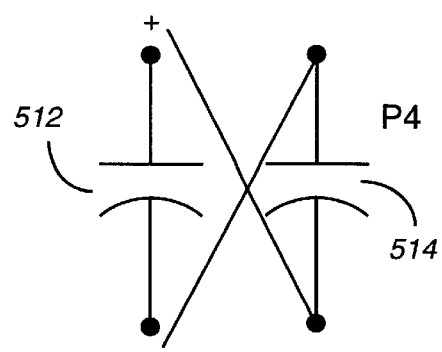

FIGS. 9–13 illustrate the example in which each bandpass integrator comprises 2 capacitors. Capacitors 512 and 514 of bandpass integrator 510 are referred to in the drawings, for explanatory purposes, though it should be understood that the operation of bandpass integrator 530 is the same. The switch controller 596 generates four switch control signals, P1, P2, P3 and P4 which alternate the connection configuration of the capacitors of the corresponding bandpass integrator between positive, floating and negative configurations. As shown in FIG. 10, when P1 is high, the switch network 516 connects capacitor 512 in a normal or positive configuration to the differential output of the differential transconductance amplifier 518; and capacitor 514 is floating. In FIG. 11, it is shown that when P2 is high, capacitor 512 is floating, and capacitor 514 is connected in a normal or positive configuration to the differential output of the differential transconductance amplifier 518. In FIG. 12, it is shown that when P3 is high, capacitor 512 is connected in a negative or inverted configuration to the output of the differential output of the differential transconductance amplifier 518; and capacitor 514 is floating. Similarly, as shown in FIG. 13, when P4 is high, capacitor 512 is floating and capacitor 514 is connected in a negative or inverted configuration to the output of the differential output of the differential transconductance amplifier 518.

The output of the bandpass sigma delta data converter 500 is a bandpass filtered digital output representation of the differential analog input signal. In all other respects, the bandpass sigma delta data converter 500 operates in a similar manner to the sigma delta data converter shown in FIG. 2.

The above description is intended by way of example only and is not intended to limit the present invention in any way except as set forth in the following claims.

What is claimed is:

1. An analog-to-digital converter comprising:
    an integrator block comprising a plurality of integrators connected in a cascade configuration, the integrator block having an input receiving an analog input signal and integrating the analog input signal to generate at an output an integrator output signal, the integrator block comprising a feed-forward connection path between the input of the integrator block and an input of at least one of the plurality of integrators;
    a comparator coupled to the output of the integrator block and continuously generating as output a digital value representing a difference between the integrator output signal with respect to a threshold;
    a digital sampling element coupled to the output of the comparator and sampling the output of the comparator in response to a sampling clock signal at a predetermined sampling frequency to generate as output a digital signal comprising samples of the digital value output by the comparator; and a feedback path connecting an analog feedback signal derived from the digital signal output by the digital sampling element to at least the input of the integrator block.

2. The analog-to-digital converter of claim 1, wherein the integrator block comprises first and second integrators, the first integrator integrating the analog input signal and generating a first integrated signal, and wherein the feed-forward connection path connects the analog input signal to the input of the second integrator which integrates a signal which is a sum of the analog input signal, the first integrated signal and the feedback signal.

3. The analog-to-digital converter of claim 1, wherein the comparator generates a digital value comprising at least one bit, and wherein the digital sampling element comprises a flip-flop coupled to the output of the comparator, the flip-flop being clocked by the sampling clock signal.

4. The analog-to-digital converter of claim 1, wherein the comparator generates a digital value comprising a plurality of bits, and wherein the digital sampling element comprises a multi-bit sampling element clocked by the sampling clock signal.

5. The analog-to-digital converter of claim 1, wherein the integrator block is a low pass integrator block.

6. The analog-to-digital converter of claim 1, wherein the integrator block is a bandpass integrator block.

7. The analog-to-digital converter of claim 6, wherein each of the plurality of integrators is a bandpass integrator comprising a plurality of capacitors and a switch network to connect the plurality of capacitors in either a positive, negative or floating configuration; and wherein the analog-to-digital converter further comprises:

is a switch controller for generating switch control signals coupled to each switch network to alternate a connection configuration of each of the plurality of capacitors between positive, floating and negative configurations.

8. A communication device comprising the analog-to-digital converter of claim 1.

9. The communication device of claim 8, and further comprising:

an antenna for detecting a radio frequency signal;

an amplifier connected to the antenna and amplifying the radio frequency signal to generate a amplified signal;

a mixer coupled to the amplifier and mixing the amplified signal with an oscillator signal to generate a mixed down signal;

a baseband filter coupled to the mixer to filter the mixed down signal and generate a baseband signal;

wherein the analog-to-digital converter is coupled to the baseband filter to receive the baseband signal as the analog input signal and which outputs the digital signal that represents the baseband signal;

an intermediate frequency filter coupled to the analog-to-digital converter to filter the digital signal output thereby to generate a filtered digital signal representing the baseband signal.

10. A selective call receiver comprising the communication device of claim 9, and further comprising:

a demodulator coupled to the intermediate frequency filter and demodulating the filtered digital signal to generate a digital demodulated signal;

a symbol synchronizer coupled to the demodulator to determine symbol centers of symbols of the digital demodulated signal;

a bit slicer coupled to the symbol synchronizer and to the demodulator to output digital data corresponding to symbols of the digital demodulated signal;

a decoder coupled to the bit slicer to decode the digital data and to output address information and message information extracted from the digital data; and a controller coupled to the decoder and comparing the address information with a stored address assigned to the selective call receiver.

11. A communication device comprising the sigma delta analog-to-digital converter of claim 1, and further comprising:

an antenna for detecting a radio frequency signal;

an amplifier connected to the antenna and amplifying the radio frequency signal to generate a amplified signal;

a mixer coupled to the amplifier and mixing the amplified signal with an oscillator signal to generate a mixed down signal;

a baseband filter coupled to the mixer to filter the mixed down signal and generate a baseband signal; and wherein the sigma delta analog-to-digital converter is coupled to the baseband filter to receive the baseband signal as the differential analog input signal and which outputs the digital signal representing the baseband signal.

12. An analog-to-digital converter comprising:

an integrator block comprising a plurality of integrators connected in a cascade configuration, the integrator block having an input receiving an analog input signal and integrating the analog input signal to generate at an output an integrator output signal, the integrator block comprising a feed-forward connection path between the input of the integrator block and an input of at least one of the plurality of integrators;

a comparator coupled to the output of the integrator block and continuously generating as output a digital value representing a difference between the integrator output signal with respect to a threshold;

a digital sampling element coupled to the output of the comparator and sampling the output of the comparator in response to a sampling clock signal at a predetermined sampling frequency to generate as output a digital signal comprising samples of the digital value output by the comparator; and a feedback path connecting an analog feedback signal derived from the digital signal output by the digital sampling element to the integrator block, wherein the integrator block comprises first and second integrators, the first integrator integrating the analog input signal and generating a first integrated signal, and wherein the feed-forward connection path connects the analog input signal to the input of the second integrator which integrates a signal which is a sum of the analog input signal, the first integrated signal and the feedback signal, and wherein the first and second integrators are first and second differential integrators, respectively, each having differential inputs and differential outputs, the differential outputs of the first differential integrator being connected to the differential inputs of the second differential integrator, the analog input signal being a differential analog input signal and the first differential integrator integrating the differential analog input signal and generating a first integrated differential signal;

the feedback path comprising a differential feedback path connecting a differential feedback signal derived from the digital signal to the first and second differential integrators;

the feed-forward connection path connecting the differential analog input signal the input of the second differential integrator, the second differential integrator integrating a differential signal which is a sum of the first integrated differential signal, the differential analog input signal and a differential feedback signal to generate a second integrated differential signal corresponding to the integrator output signal;

wherein the differential outputs of the second differential integrator are connected to first and second inputs of the comparator, the comparator comparing levels of component signals of the second integrated differential signal and continuously generating as output a digital value which represents a difference between the component signals of the second integrated differential signal.

13. An analog-to-digital converter comprising:

an integrator block comprising a plurality of integrators connected in a cascade configuration, the integrator block having an input receiving an analog input signal and integrating the analog input signal to generate at an output an integrator output signal, the integrator block comprising a feed-forward connection path between the input of the integrator block and an input of at least one of the plurality of integrators;

a comparator coupled to the output of the integrator block and continuously generating as output a digital value representing a difference between the integrator output signal with respect to a threshold;

a digital sampling element coupled to the output of the comparator and sampling the output of the comparator in response to a sampling clock signal at a predetermined sampling frequency to generate as output a digital signal comprising samples of the digital value output by the comparator; and a feedback path connecting an analog feedback signal derived from the digital signal output by the digital sampling element to the integrator block, wherein the integrator block comprises first and second integrators, the first integrator integrating the analog input signal and generating a first integrated signal, and wherein the feed-forward connection path connects the analog input signal to the input of the second integrator which integrates a signal which is a sum of the analog input signal, the first integrated signal and the feedback signal, and wherein the integrator block comprises first, second and third integrators, the first integrator integrating the analog input signal and generating a first integrated signal, and wherein the feed-forward connection path connects the analog input signal to the input of the second integrator which integrates a signal which is a sum of the analog input signal, the first integrated signal and the feedback signal, and connects the analog input signal to the input of the second integrator which integrates a signal which is a sum of the analog input signal, the second integrated signal and the feedback signal.

14. The analog-to-digital of claim 13, wherein each of the first, second and third integrators are differential integrators, respectively, each having differential inputs and differential outputs, the differential outputs of the first differential integrator being connected to the differential inputs of the second differential integrator, and the differential outputs of the second differential integrator being connected to the differential inputs of the third differential integrator, the analog input signal being a differential analog input signal and the first differential integrator integrating the differential analog input signal and generating a first integrated differential signal;

the feedback path comprising a differential feedback path connecting a differential feedback signal derived from the digital signal to the first, second and third differential integrators;

the feed-forward connection path connecting the differential analog input signal to the differential inputs of the second differential integrators which integrates a differential signal which is a sum of the first integrated differential signal, the differential analog input signal and the differential feedback signal to generate a second integrated differential signal, and connecting the differential analog input signal to the differential inputs of the third differential integrator which integrates a differential signal which is a sum of the second integrated differential signal, the differential analog input signal and the differential feedback signal to generate a third integrated differential signal corresponding to the integrator output signal; and wherein the differential outputs of the third differential integrator are connected to first and second inputs of the comparator, the comparator comparing levels of the component signals of the third integrated differential signal and continuously generating as output a digital value which represents a difference between the component signals of the third integrated differential signal.

15. A sigma delta analog-to-digital converter comprising:

a first differential integrator having differential inputs and differential outputs, the differential inputs coupled to receive a differential analog input signal and integrating a differential analog input signal to generate a first integrated differential signal;

a second differential integrator having differential inputs and differential outputs, the differential inputs coupled to the differential outputs of the first differential integrator;

a feed-forward connection path between the differential inputs of the first differential integrator and the differential inputs of the second differential integrator to connect the differential analog input signal to the differential inputs of the second differential integrator;

the second differential integrator integrating a differential signal which is a sum of the differential analog input signal, the first integrated differential signal and a differential feedback signal to generate a second integrated differential signal;

a comparator coupled to the differential outputs of the second differential integrator and continuously generating as output digital values representing a difference between component signals of the second integrated differential signal;

a digital sampling element coupled to the output of the comparator and sampling the output of the comparator in response to a sampling clock signal at a predetermined sampling frequency to generate as output a digital signal comprising samples of the digital values output by the comparator; and a differential integrator feedback path connecting the differential analog feedback signal which is derived from the digital signal to the differential inputs of the first and second differential integrators.

16. The sigma delta analog-to-digital converter of claim 15, wherein the comparator generates as output at least one bit, and wherein the digital sampling element comprises a flip-flop coupled to the output of the comparator, the flip-flop being clocked by the sampling clock signal.

17. The sigma delta analog-to-digital converter of 15, wherein the comparator generates as output a plurality of bits, and wherein the digital storage element comprises a multi-bit sampling element clocked by the sampling clock signal.

18. The sigma delta analog-to-digital converter of claim 15, wherein the first and second differential integrators are low pass integrators.

19. The sigma delta analog-to-digital converter of claim 15, wherein the first and second differential integrators are bandpass integrators.

20. A sigma delta analog-to-digital converter comprising:
- a first differential integrator having differential inputs and differential outputs, the differential inputs coupled to receive a differential analog input signal and integrating a differential analog input signal to generate a first integrated differential signal;
- a second differential integrator having differential inputs and differential outputs, the differential inputs coupled to the differential outputs of the first differential integrator;
- a third differential integrator having differential inputs and differential outputs, the differential inputs coupled to the differential outputs of the second differential integrator;
- a feed-forward connection path between the differential inputs of the first differential integrator and both the differential inputs of the second differential integrator and the differential inputs of the third differential integrator;
- the second differential integrator integrating a differential signal which is a sum of the first differential integrated signal, the differential analog input signal and a differential feedback signal to generate a second integrated differential signal;
- the third differential integrator integrating a differential signal which is a sum of the second differential integrated signal, the differential analog input signal and the differential feedback signal to generate a third integrated differential signal;
- comparator coupled to the differential outputs of the third differential integrator and continuously generating as output digital values representing a difference between component signals of the third integrated differential signal;
- a digital sampling element coupled to the output of the comparator and sampling the output of the comparator in response to a sampling clock signal at a predetermined sampling frequency to generate as output a digital signal comprising samples of the digital values output by the comparator; and
- a differential integrator feedback path connecting the differential analog feedback signal which is derived from the digital signal to the differential inputs of the first, second and third differential integrators.

21. The sigma delta analog-to-digital converter of claim 20, wherein the comparator generates as output at least one bit, and wherein the digital sampling element comprises a flip-flop coupled to the output of the comparator, the flip-flop being clocked by the sampling clock signal.

22. The sigma delta analog-to-digital converter of 20, wherein the comparator generates as output a plurality of bits, and wherein the digital storage element comprises a multi-bit sampling element clocked by the sampling clock signal.

23. The sigma delta analog-to-digital converter of claim 20, wherein the first, second and third differential integrators are low pass integrators.

24. The sigma delta analog-to-digital converter of claim 20, wherein the first, second and third differential integrators are bandpass integrators.

* * * * *